(12) United States Patent
Cheng et al.

(10) Patent No.: US 7,795,661 B2
(45) Date of Patent: Sep. 14, 2010

(54) VERTICAL SOI TRANSISTOR MEMORY CELL

(75) Inventors: Kangguo Cheng, Beacon, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 11/308,105

(22) Filed: Mar. 7, 2006

(65) Prior Publication Data

US 2007/0210363 A1    Sep. 13, 2007

(51) Int. Cl.
*H01L 27/108* (2006.01)
*H01L 29/94* (2006.01)

(52) U.S. Cl. ............... 257/302; 257/303; 257/E27.084; 438/239

(58) Field of Classification Search ................ 438/239; 257/302, 303, E27.084
See application file for complete search history.

(56) References Cited

U.S. PATENT DOCUMENTS

| | | | | |
|---|---|---|---|---|
| 5,177,576 | A * | 1/1993 | Kimura et al. ................. | 257/71 |
| 5,216,266 | A * | 6/1993 | Ozaki ........................... | 257/302 |
| 6,437,388 | B1 * | 8/2002 | Radens et al. ............... | 257/301 |
| 6,455,911 | B1 * | 9/2002 | Stephani et al. ............. | 257/493 |
| 6,759,702 | B2 * | 7/2004 | Radens et al. ............... | 257/302 |
| 2002/0066925 | A1 * | 6/2002 | Gruening et al. ........... | 257/329 |
| 2003/0080346 | A1 * | 5/2003 | Weis ........................... | 257/135 |
| 2003/0168687 | A1 | 9/2003 | Chidambarrao et al. | |
| 2004/0066666 | A1 | 4/2004 | Chidambarrao et al. | |
| 2004/0157353 | A1 * | 8/2004 | Ouyang et al. ................. | 438/38 |
| 2005/0009357 | A1 * | 1/2005 | Chan et al. ................... | 438/705 |
| 2005/0042849 | A1 * | 2/2005 | Currie et al. ................. | 438/596 |
| 2005/0045947 | A1 * | 3/2005 | Chen et al. ................... | 257/336 |
| 2005/0059214 | A1 | 3/2005 | Cheng et al. | |

OTHER PUBLICATIONS

Ouyang et al, "A Novel Si/SiGe Heterojunction pMOSFET with Reduced Short-Channel Effects and Enhanced Drive Current", IEEE Transactions on Electron Devices, vol. 47, No. 10, Oct. 2000, 7 pages.*

* cited by examiner

*Primary Examiner*—Bradley K Smith
*Assistant Examiner*—Alexander Belousov
(74) *Attorney, Agent, or Firm*—Scully, Scott, Murphy & Presser, P.C.; Joseph P. Abate, Esq.

(57) ABSTRACT

The present invention relates to a semiconductor device that contains at least one trench capacitor and at least one vertical transistor, and methods for forming such a semiconductor device. Specifically, the trench capacitor is located in a semiconductor substrate and comprises an outer electrode, an inner electrode, and a node dielectric layer located between the outer electrode and the inner electrode. The vertical transistor is located over the trench capacitor and comprises a source region, a drain region, a channel region, a gate dielectric, and a gate electrode. The channel region of the vertical transistor is located in a tensilely or compressively strained semiconductor layer that is oriented perpendicularly to a surface of the semiconductor substrate. Preferably, the tensilely or compressively strained semiconductor layer is embedded in an insulator structure, so that the vertical transistor has a semiconductor-on-insulator (SOI) configuration.

10 Claims, 16 Drawing Sheets

VERTICAL SOI TRANSISTOR MEMORY CELL

FIELD OF THE INVENTION

The present invention generally relates to semiconductor devices that each comprises a vertical transistor with a tensilely or compressively strained vertical channel, and methods for fabricating the same. More specifically, the present invention relates to semiconductor memory devices that each contains at least one vertical SOI transistor with a tensilely or compressively strained vertical channel and a trench capacitor, and methods for fabricating such semiconductor memory cells.

BACKGROUND OF THE INVENTION

Integrated circuits, and particularly semiconductor memory devices utilize capacitors in a variety of ways. Dynamic random access memory devices (DRAMs) in particular employ capacitors to store charge representing a data bit. As the minimum feature size and cell architecture are scaled down, robust design points for DRAM cells utilizing planar metal oxide semiconductor field effect transistors (MOSFETs) and deep trench (DT) capacitors are increasingly difficult to achieve.

The vertical MOSFET device provides a means for better DRAM scaling, since the channel length of a vertical MOSFET is decoupled from, and is independent of, the minimum lithographic feature size used elsewhere on the chip, thus not impacting the overall device density on the chip.

FIG. 1 illustrates a conventional DRAM cell 1 that contains a vertical MOSFET 2 coupled with a DT capacitor 4. Specifically, the entire DRAM cell 1 is located in a trench formed in a semiconductor substrate 10.

The DT capacitor 4 is located in a lower portion of the trench and comprises a buried plate electrode (or outer electrode) 42, a node dielectric layer 44, and a conductive trench fill (or inner electrode) 46. The outer electrode 42 is typically formed by doping the sidewalls of the lower portion of the trench with an n-type or a p-type dopant species, and the inner electrode 46 typically comprises polysilicon doped with the same n-type or p-type dopant species as the outer electrode 42.

The vertical MOSFET 2 is located on top of the DT capacitor 4 in an upper portion of the trench. The vertical MOSFET 2 comprises a bit contact diffusion (or source) region 22, a buried strap out-diffusion (or drain) region 24, a channel region 23 located between 22 and 24, a gate dielectric layer 28, and a gate electrode 26. The channel region 23 of the vertical MOSFET 2 is electrically isolated from the gate electrode 26 by the gate dielectric layer 28.

The drain region 24 of the vertical MOSFET 2 is electrically connected with the inner electrode 46 of the DT capacitor 4. However, the gate electrode 26 of the vertical MOSFET 2 is electrically isolated from the inner electrode 46 of the DT capacitor 4 by a horizontal isolation layer 32, and the drain region 24 of the vertical MOSFET 2 is electrically isolated from the outer electrode 42 of the DT capacitor 4 by a vertical isolation collar 34 that is formed over the trench sidewalls. A pad layer 16 covers a surface of the semiconductor substrate 10 around the trench. A conductive plug 12 formed of either doped polysilicon or any other suitable conductive material is provided at the trench opening as the gate contact for the vertical MOSFET 2. An optional sidewall spacer 14 can further be provided to ensure complete electrical isolation between the conductive plug 12 and the source region 22 of the vertical MOSFET 2.

There is a continuing need for improved vertical MOSFET structures that can be readily incorporated into the DRAM devices to improve the device performance.

There is further a need for methods that can readily integrate the processing steps required for fabricating such improved vertical MOSFET structures into the DRAM device fabrication processes.

SUMMARY OF THE INVENTION

The present invention, in one aspect, relates to a semiconductor device, comprising:
at least one trench capacitor located in a semiconductor substrate, the at least one trench capacitor comprising an outer electrode, an inner electrode, and a node dielectric layer located between the outer electrode and the inner electrode; and
at least one vertical transistor located over the at least one trench capacitor, wherein the at least one vertical transistor comprises a source region, a drain region, a channel region, a gate dielectric, and a gate electrode, wherein the channel region of the at least one vertical transistor is located in a tensilely or compressively strained semiconductor layer that is oriented perpendicularly to a surface of the semiconductor substrate, and wherein the tensilely or compressively strained semiconductor layer is embedded in an insulator structure located over the semiconductor substrate, so that the at least one vertical transistor has a semiconductor-on-insulator (SOI) configuration.

The present invention, in another aspect, relates to a method for forming a semiconductor device, comprising:
depositing a first semiconductor layer over a surface of a semiconductor substrate, wherein the first semiconductor layer has a different lattice constant than the semiconductor substrate;
forming at least one trench that extends through the first semiconductor layer into the semiconductor substrate;
epitaxially growing a second semiconductor layer over sidewalls of the trench, wherein the second semiconductor layer has a lattice constant that is different from that of the first semiconductor layer, so that an upper portion of the second semiconductor layer formed over the sidewalls of the trench in the first semiconductor layer is either tensilely or compressively strained;
forming a trench capacitor and a vertical transistor in the trench, wherein the trench capacitor comprises an outer electrode, an inner electrode, and a node dielectric layer located between the outer electrode and the inner electrode, wherein the vertical transistor is located over the trench capacitor, wherein the vertical transistor comprises a source region, a drain region, a channel region, a gate dielectric, and a gate electrode, and wherein the channel region of the vertical transistor is located in the tensilely or compressively strained upper portion of the second semiconductor layer;
selectively removing a portion of the first semiconductor layer to expose at least the tensilely or compressively strained upper portion of the second semiconductor layer; and
forming an insulator structure around the tensilely or compressively strained upper portion of the second semiconductor layer.

In a further aspect, the present invention relates to a semiconductor device located over a semiconductor substrate and comprising at least one vertical transistor having a source region, a drain region, a channel region, a gate dielectric, and a gate electrode, wherein the channel region of the at least one vertical transistor is located in a tensilely or compressively strained semiconductor layer that is oriented perpendicularly to a surface of the semiconductor substrate, and wherein the tensilely or compressively strained semiconductor layer is embedded in an insulator structure located over the semiconductor substrate, so that the at least one vertical transistor has a semiconductor-on-insulator (SOI) configuration.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1:
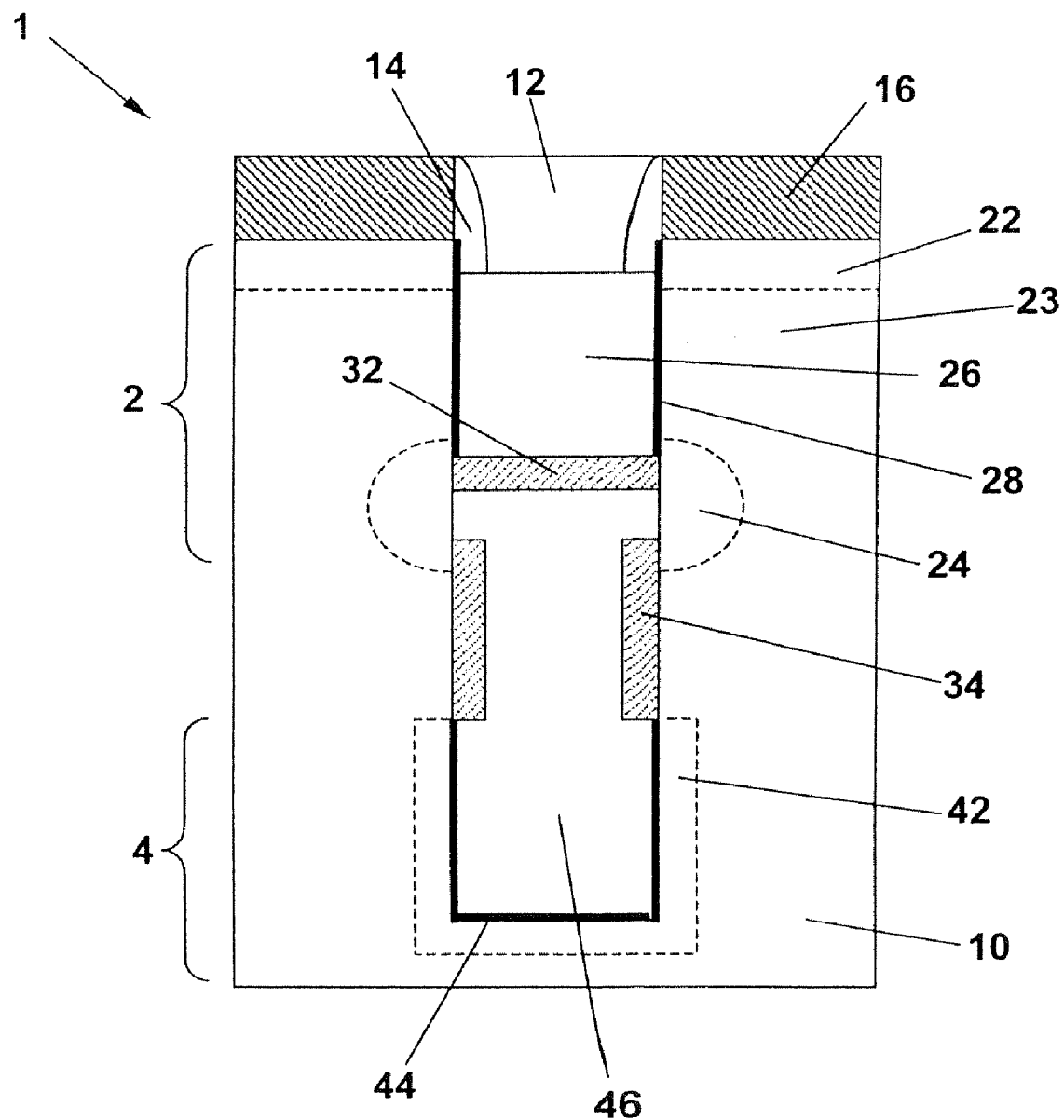
FIG. 1 shows a cross-sectional view of a DRAM cell comprising a conventional vertical MOSFET and a DT capacitor.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides improved vertical MOSFET structures that each comprises a tensilely or compressively strained vertical channel.

The term "vertical" as used herein refers to a structure that is oriented perpendicularly, instead of horizontally, to a substrate surface. The vertical channel of a vertical MOSFET device defines a current flow that is perpendicular to the substrate surface. The vertical channel provides a channel length that is independent of the total width or footprint of the vertical MOSFET device. In this manner, the channel length can be increased without increasing the footprint of the vertical MOSFET device, or it can be maintained substantially the same while further reducing the footprint of the vertical MOSFET device.

The tensile or compressive strain functions to achieve enhanced carrier mobility in the vertical channel of the vertical MOSFET of the present invention. Mechanical strains within a semiconductor device substrate can be used to modulate device performance. For example, in a silicon film, hole mobility is enhanced when the silicon film contains compressive strain in the film direction, while the electron mobility is enhanced when the silicon film contains tensile strain in the film direction. Therefore, compressive and/or tensile strains in the channel regions of p-channel MOSFETs and/or n-channel MOSFETs function to enhance the carrier mobility and thereby the device performance of the MOSFETs.

Further, carrier mobility is known to differ significantly along different crystallographic orientations. For example, electrons have a high mobility along the {100} crystal planes of silicon, but holes have high mobility along the {110} crystal planes of silicon. Therefore, the carrier mobility enhancement provided by the tensilely or compressively strained vertical channel of the present invention can be used advantageously to compensate for the mobility degradation caused by channel alignment along a non-optimal crystallographic orientation.

In a preferred, but not necessary, embodiment of the present invention, the source, drain, and channel regions of the vertical MOSFET are all located in a tensilely or compressively strained thin semiconductor layer (e.g., having a layer thickness ranging from about 5 nm to about 100 nm) that is vertically oriented, i.e., in perpendicular to the substrate surface.

More preferably, the tensilely or compressively strained vertical semiconductor layer of the present invention is embedded in an insulator structure, thereby providing a semiconductor-on-insulator (SOI) configuration for the vertical MOSFET. Such an SOI configuration functions, not only to reduce the substrate leakage current in the vertical MOSFET, but also to provide an improved isolation of adjacent vertical MOSFET devices located in the same substrate by preventing merging or overlapping between the buried strap out-diffusion regions of the vertical adjacent MOSFET devices.

For a vertical n-channel MOSFET (n-MOSFET), it is preferred that the vertical semiconductor layer in which the channel of the vertical n-MOSFET is located is tensilely strained, thereby providing enhanced electron mobility in the channel region of the vertical n-MOSFET. Alternatively, for a vertical p-channel MOSFET (p-MOSFET), it is preferred that the vertical semiconductor layer in which the channel of the vertical p-MOSFET is located is compressively strained, thereby providing enhanced hole mobility in the channel region of the vertical p-MOSFET.

The vertical MOSFET of the present invention can be readily integrated with other semiconductor devices to form a suitable logic circuitry.

For example, the vertical MOSFET can be integrated with a deep trench (DT) capacitor to form a DRAM cell. Specifically, the DT capacitor is located in a trench in a semiconductor substrate, and the vertical MOSFET is located over the DT capacitor. Preferably, the inner electrode (or conductive trench fill) of the DT capacitor is electrically connected to the drain region (or buried strap out-diffusion region) of the vertical MOSFET, and the outer electrode (or buried plate electrode) of the DT capacitor is electrically isolated from the drain region (or buried strap out-diffusion region) of the vertical MOSFET. The electrical isolation between the outer electrode of the DT capacitor and the drain region of the vertical MOSFET can be achieved by opposite doping of a semiconductor region located between the outer electrode of the DT capacitor and the drain region of the vertical MOSFET. For example, when the outer electrode of the DT capacitor and the drain region of the vertical MOSFET are both doped with an n-type dopant species, the semiconductor region located therebetween can be doped with a p-type dopant species to provide the necessary insulation. Alternatively, when the outer electrode of the DT capacitor and the drain region of the vertical MOSFET are both doped with a p-type dopant species, the semiconductor region located therebetween can be doped with an n-type dopant species. The electrical isolation between the outer electrode of the DT capacitor and the drain region of the vertical MOSFET can also be achieved by using an isolation collar that is typically employed in conventional DRAM cells. However, use of the opposite doping eliminates the need for a separate isolation collar, thereby simplifying the DRAM cell structure.

The vertical MOSFET of the present invention is preferably fabricated in a SiGe, Ge, or SiC substrate, which may also be used for fabricating high performance planar MOSFET structures with tensilely or compressively strained channels. Therefore, the vertical MOSFET of the present invention can be readily integrated with high performance planar MOSFETs, to form various types of embedded memory devices.

Figure 2:
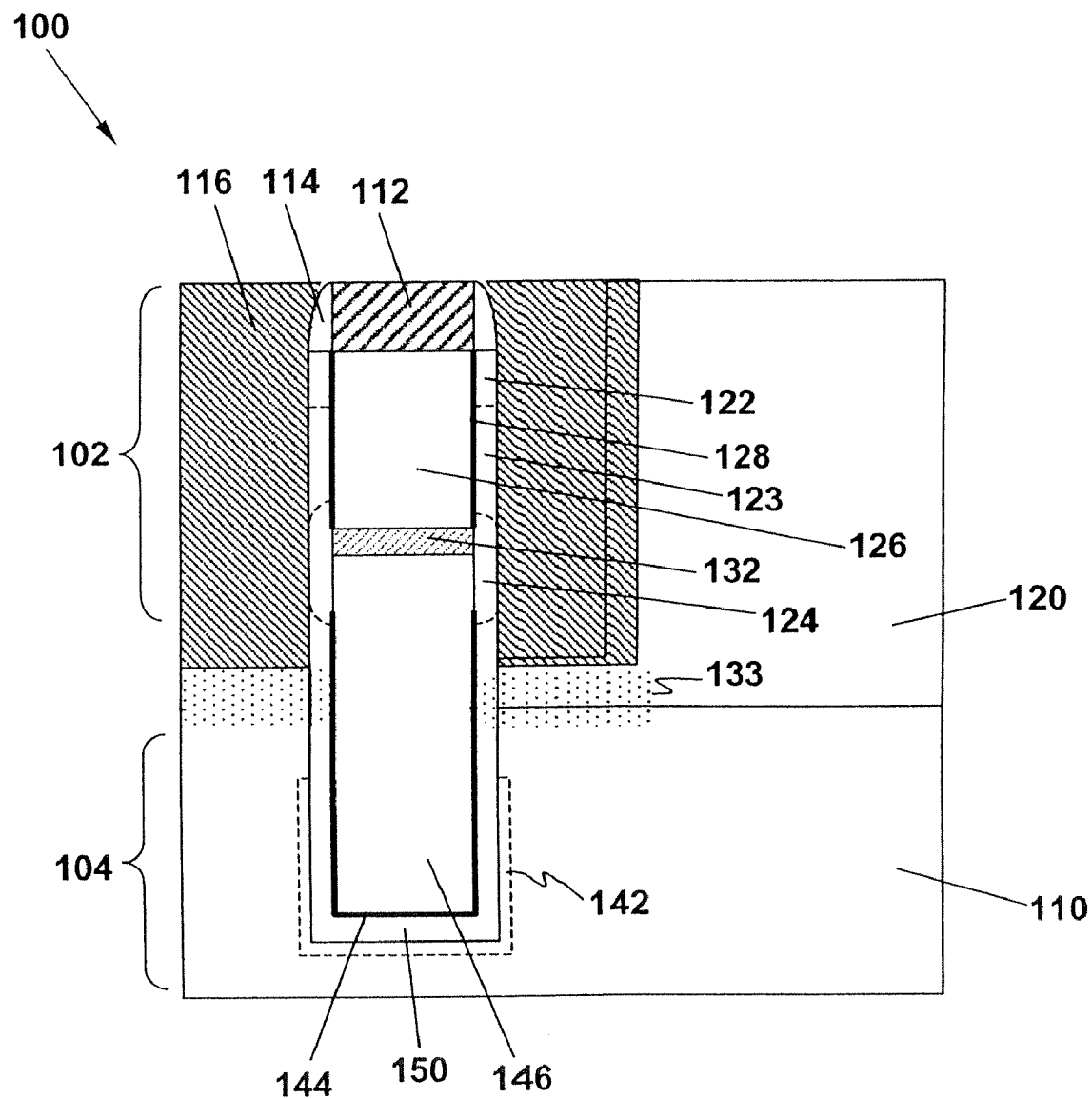
FIG. 2 shows a cross-sectional view of a DRAM cell comprising a vertical SOI transistor with a tensilely or compressively strained vertical channel and a DT capacitor, where the vertical SOI transistor and the DT capacitor are isolated from each other by a doped semiconductor region, according to one embodiment of the present application.

FIG. 2 shows a cross-sectional view of an exemplary DRAM cell 100 that contains a vertical MOSFET 102 and a DT capacitor 104, according to a specific embodiment of the present invention.

The DRAM cell 100 is located in a hybrid semiconductor substrate that contains a base substrate 110 and an upper substrate layer 120, which comprise different semiconductor materials having different lattice constants. The base substrate 110 and the upper substrate layer 120 may comprise any semiconductor material including, but not limited to: Si, SiC, SiGe, SiGeC, Ge alloys, GaAs, InAs, InP, as well as other III-V or II-VI compound semiconductors. The base substrate 110 may further comprise a layered semiconductor structure such as Si/SiGe, a silicon-on-insulator structure or a SiGe-on-insulator structure. The base substrate 110 may be doped, undoped or contain doped and undoped regions therein (not shown). The doped device regions are typically known as "wells".

In a preferred, but not necessary, embodiment of the present invention, when the base substrate 110 comprises single crystal silicon, the upper substrate layer 120 may comprise single crystal SiGe, Ge, SiC, or any other semiconductor material having a different lattice constant than single crystal silicon.

A trench is formed in the hybrid semiconductor substrate and extends from the substrate surface through the upper substrate layer 120 into the base substrate 110. An epitaxial semiconductor layer 150 is formed over the interior surfaces of the trench.

In a preferred but not necessary embodiment, the epitaxial semiconductor layer 150 comprises substantially the same semiconductor material as the base substrate 110. In this manner, a lower portion of the epitaxial semiconductor layer 150 located in a lower portion of the trench in the base substrate 110 is relaxed, because the lower portion of the epitaxial semiconductor layer 150 has the same lattice constant as the base substrate 110, and therefore no strain is generated in this portion of the epitaxial semiconductor layer 150. However, an upper portion of the epitaxial semiconductor layer 150 located in an upper portion of the trench in the upper substrate layer 120 is either tensilely or compressively strained, because the upper portion of the epitaxial semiconductor layer 150 has a different lattice constant than the upper substrate layer 120. The lattice mismatch between the upper substrate layer 120 and the upper portion of the semiconductor layer 150, which is epitaxially grown thereupon, results in crystal lattice distortion in the upper portion of the semiconductor layer 150, which in turn generates tensile or compressive strain therein.

In an alternative embodiment, the epitaxial semiconductor layer 150 comprises a semiconductor material having a lattice constant that is different from the base substrate 110 and the upper substrate layer 120. In this manner, the entire epitaxial semiconductor layer 150 is either tensilely or compressively strained, due to the lattice constant differences between layer 150 and the base substrate 110 as well as the upper substrate layer 120.

For forming vertical MOSFET with an n-channel, the upper substrate layer 120 preferably comprises SiGe or Ge, and the semiconductor layer 150 preferably comprises silicon, so that the upper portion of the semiconductor layer 150, which is epitaxially grown over the trench sidewalls in the upper substrate layer 120, is tensilely strained to enhance the channel electron mobility. For forming vertical MOSFET with a p-channel, the upper substrate layer 120 preferably comprises SiC, and the semiconductor layer 150 preferably comprises silicon, so that the upper portion of the semiconductor layer 150, which is epitaxially grown over the trench sidewalls in the upper substrate layer 120, is compressively strained to enhance the channel hole mobility.

The vertical MOSFET 102 and the DT capacitor 104 are both located inside the trench. Specifically, the DT capacitor 104 is located in the lower portion of the trench in the base substrate 110, and the vertical MOSFET 102 is located over the DT capacitor 104 in the upper portion of the trench in the upper substrate layer 120.

The DT capacitor 104 comprises a buried plate electrode (or outer electrode) 142, a node dielectric layer 144, and a conductive trench fill (or inner electrode) 146.

The vertical MOSFET 102 comprises a bit contact diffusion (or source) region 122, a buried strap out-diffusion (or drain) region 124, a channel region 123 located between 122 and 124, a gate dielectric layer 128, and a gate electrode 126. Specifically, the source region 122, the channel region 123, and the drain region 124 of the vertical MOSFET 102 are all located in the tensilely or compressively strained upper portion of the epitaxial semiconductor layer 150. In this manner, the vertical MOSFET 102 comprises a tensilely or compressively strained vertical channel 123 that is orientated along the trench sidewalls, thereby defining a channel current flow direction that is perpendicular to the substrate surface.

In a particularly preferred embodiment of the present invention, a portion of the upper substrate layer 120 surrounding the vertical MOSFET 102 is selectively removed and replaced by an insulator material 116. Therefore, the tensilely or compressively strained upper portion of the epitaxial semiconductor layer 150, which contains the channel region 123 of the vertical MOSFET 102, is embedded in the insulator structure 116. Consequently, the vertical MOSFET 102 is imparted with a semiconductor-on-silicon (SOI) configuration, which reduces the substrate leakage current in the vertical MOSFET 102.

Further, the insulator structure 116 provides electrical isolation between the vertical MOSFET 102 shown in FIG. 2 from adjacent devices (not shown) that are located in the same substrate. In conventional vertical MOSFET structures as shown in FIG. 1, the buried strap out-diffusion regions of adjacent vertical MOSFETs tend to overlap or merge with one another, causing electrical shorting or interference therebetween. The insulator structure 116 as shown in FIG. 2, effectively isolates the buried strap out-diffusion regions of adjacent vertical MOSFETs and thus eliminates the undesired overlapping or merging therebetween.

The gate electrode 126 of the vertical MOSFET 102 is electrically isolated from the inner electrode 146 of the DT capacitor 104 by a trench top oxide (TTO) layer 132. The drain region 124 of the vertical MOSFET 102 is electrically connected with the inner electrode 146 of the DT capacitor 104, but is isolated from the outer electrode 142 of the DT capacitor 104.

The isolation between the drain region 124 of the vertical MOSFET 102 and the outer electrode 142 of the DT capacitor 104 can be achieved by any suitable isolation means. As a specific example, FIG. 2 shows a doped region 133 that is located between the drain region 124 of the vertical MOSFET 102 and the outer electrode 142 of the DT capacitor 104. The doped region 133 contains a dopant species that has a conductivity type opposite to that of the drain region 124 of the vertical MOSFET 102 and the outer electrode 142 of the DT capacitor 104. For instance, when the vertical MOSFET 102 is an n-MOSFET, the drain region 124 of the vertical n-MOSFET 102 and the outer electrode 142 of the DT capacitor 104 are both doped with n-type dopant species, and the doped region 133 should therefore be doped with p-type dopant species, in order to provide the necessary insulation between the drain region 124 of the vertical MOSFET 102 and the outer electrode 142 of the DT capacitor 104. On the other hand, when the vertical MOSFET 102 is a p-MOSFET, the drain region 124 of the vertical p-MOSFET 102 and the outer electrode 142 of the DT capacitor 104 are both doped with p-type dopant species, and the doped region 133 should therefore be doped with n-type dopant species. The isolation between the drain region 124 of the vertical MOSFET 102 and the outer electrode 142 of the DT capacitor 104 can also be achieved by using an isolation collar that is the same as that shown in FIG. 1.

The opening of the trench is preferably filled with a conductive material (either a doped polysilicon or any other suitable conductive material, such as metal, metal alloy, metal silicide, or metal nitride) to form a conductive plug or contact 112, which functions as the gate contact for the vertical MOSFET 102. An optional sidewall spacer 114 may be provided to ensure complete electrical isolation between the conductive plug 112 and the source region 122 of the vertical MOSFET 102.

Figure 3:
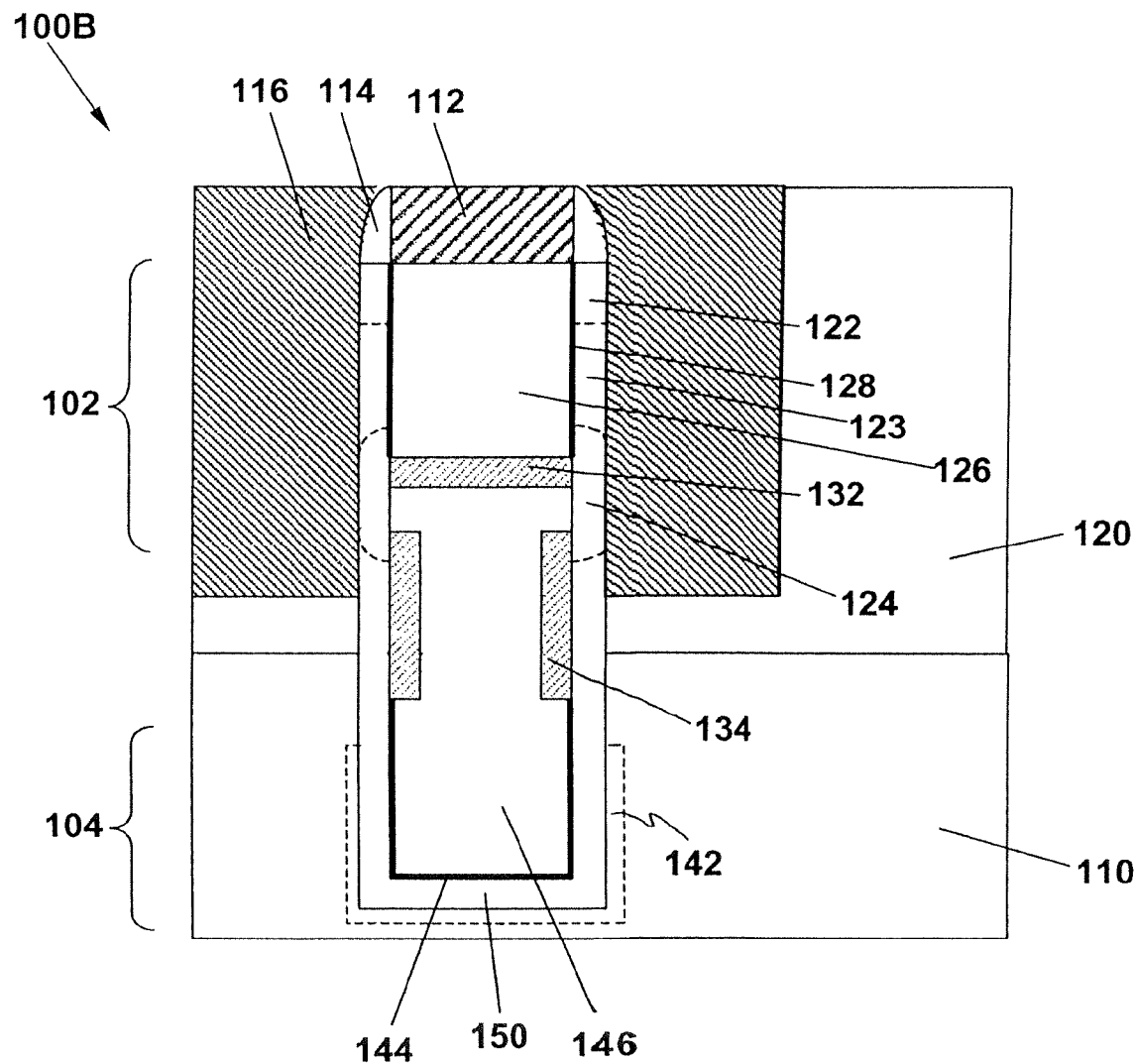
FIG. 3 shows a cross-sectional view of a DRAM cell comprising a vertical SOI transistor with a tensilely or compressively strained vertical channel and a DT capacitor, where the vertical SOI transistor and the DT capacitor are isolated from each other by an isolation collar, according to one embodiment of the present application.

FIG. 3 shows the cross-sectional view of another exemplary DRAM cell 100B, according to another specific embodiment of the present invention. The DRAM cell 100B is substantially the same as the DRAM cell 100 shown in FIG. 2, with the exception that an isolation collar 134, instead of an oppositely doped region, is employed from electrically isolating the drain region 124 of the vertical MOSFET 102 and the outer electrode 142 of the DT capacitor 104.

Figure 4:
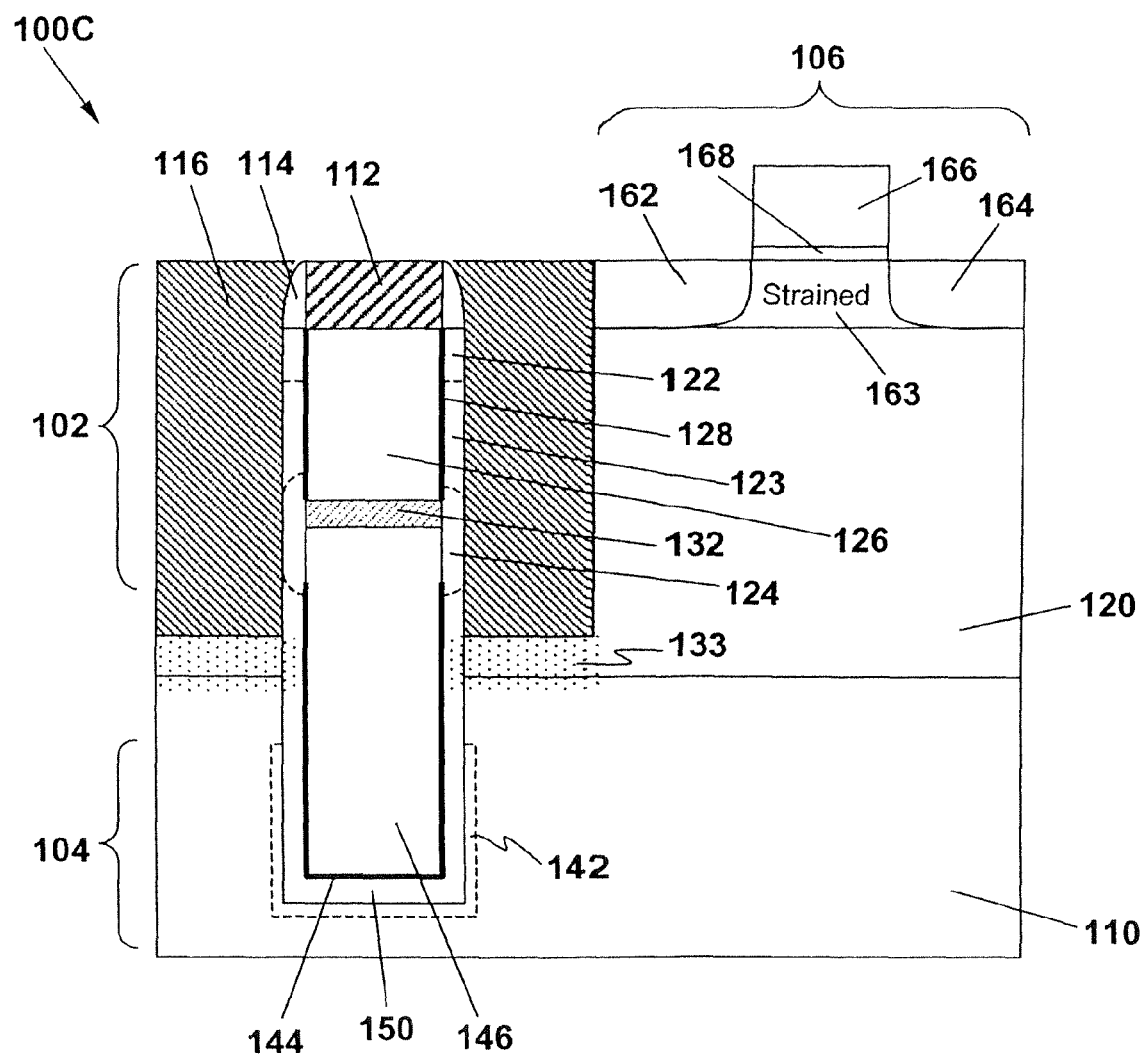
FIG. 4 shows a cross-sectional view of a semiconductor device that comprises the DRAM cell of FIG. 2 integrated with a planar MOSFET with a tensilely or compressively strained planar channel layer, according to one embodiment of the present invention.

FIG. 4 shows the cross-sectional view of a semiconductor device 100C, according to yet another specific embodiment of the present invention. The semiconductor device 100C comprises the DRAM cell 100 as shown in FIG. 2, and it also comprises an additional semiconductor device, namely, a planar MOSFET 106. The planar MOSFET device 106 is located over an upper surface of the upper substrate layer 120 and comprises a source region 162, a drain region 164, a horizontally oriented channel layer 163 (i.e., planar channel), a gate dielectric layer 168, and a gate electrode 166. The planar channel 163 of the MOSFET 106 is epitaxially grown on top of the upper substrate layer 120, but it comprises the same semiconductor material as the base substrate 110. In this manner, a lattice mismatch is present between the planar channel 163 of the MOSFET 106 and the underlying substrate layer 120, which leads to generation of tensile or compressive strain in the channel layer 163. Therefore, channel carrier mobility can be advantageously increased in the planar MOSFET 106 for enhanced device performance.

Figure 5:
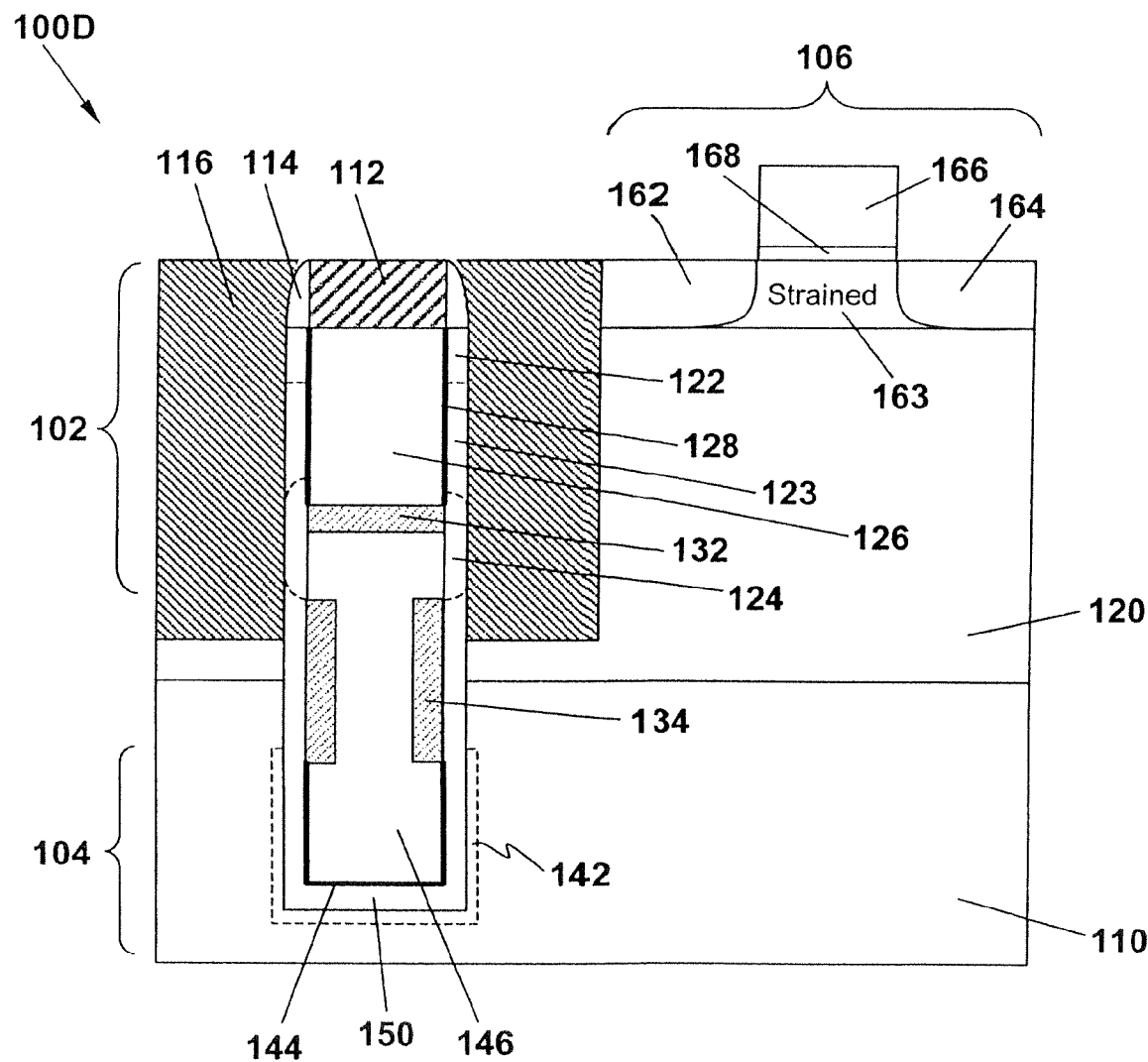
FIG. 5 shows a cross-sectional view of a semiconductor device that comprises the DRAM cell of FIG. 3 integrated with a planar MOSFET with a tensilely or compressively strained planar channel layer, according to one embodiment of the present invention.

FIG. 5 shows the cross-sectional view of another semiconductor device 100D, according to a still further embodiment of the present invention. The semiconductor device 100D is substantially the same as the semiconductor device 100C shown in FIG. 4, with the exception that an isolation collar 134, instead of an oppositely doped region, is employed from electrically isolating the drain region 124 of the vertical MOSFET 102 and the outer electrode 142 of the DT capacitor 104.

Note that while FIGS. 2-5 illustratively demonstrate exemplary DRAM cells and semiconductor device structures according to specific embodiments of the present invention, it is clear that a person ordinarily skilled in the art can readily modify such device structures for adaptation to specific application requirements, consistent with the above descriptions. For example, the epitaxial semiconductor layer 150 may be selectively deposited over trench sidewalls only in the upper portion, but not the lower portion of the trench, by first covering the lower portion of the trench with the node dielectric layer 144, and then depositing the epitaxial semiconductor layer 150 using a selective epitaxial method (i.e., which only grows semiconductor material over a semiconductor surface, but not over dielectric surface). Further, the vertical MOSFET 102 of the present invention may be integrated with other semiconductor devices, such as transistors, diodes, capacitors, resistors, and inductors, to form memory devices other than DRAM cells.

FIGS. 6A-6G illustrate the exemplary processing steps for forming the DRAM cell 100 as shown in FIG. 2, according to one embodiment of the present invention.

Figure 6A:
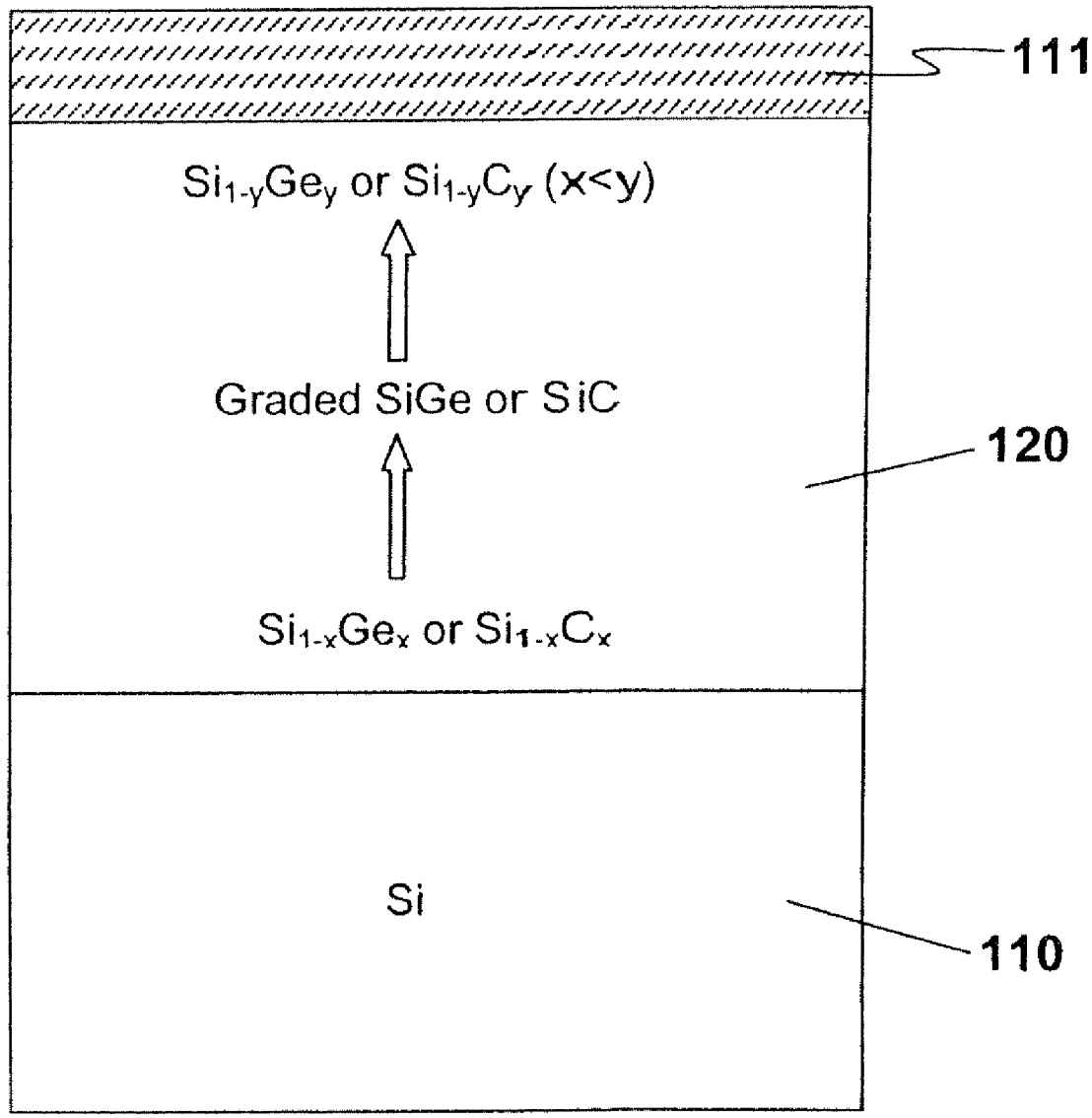
FIGS. 6A-6G are cross sectional views that illustrate the processing steps for forming the DRAM cell of FIG. 2, according to one embodiment of the present invention.

Reference is first made to FIG. 6A, which shows formation of a hybrid semiconductor substrate that comprises a base substrate 110 comprising single crystal silicon and an upper semiconductor substrate layer 120 comprising SiGe (for forming an n-channel vertical MOSFET) or SiC (for forming a p-channel vertical MOSFET).

In a particularly preferred embodiment of the present invention, the upper semiconductor substrate layer 120 has a graded germanium or carbon content profile, i.e., a lowest portion of the layer 120 immediately adjacent to the silicon base substrate surface has a lowest germanium or carbon content ($Si_{1-x}Ge_x$ or $Si_{1-x}C_x$), while the uppermost portion of the layer 120 away from the silicon base substrate surface has a highest germanium or carbon content ($Si_{1-y}Ge_y$ or $Si_{1-y}C_y$, where x<y).

Alternatively, the upper semiconductor substrate layer 120 can have a constant germanium or carbon content profile, and it can be pre-formed over a SiGe or SiC substrate via homoepitaxial growth, and then transferred to the base substrate 110 using wafer bonding techniques.

In another embodiment, the upper semiconductor substrate layer 120 may contain a first layer (not shown) having a graded germanium or carbon content profile and a second layer (not shown) having a constant germanium or carbon content profile atop the first layer.

Figure 6B:
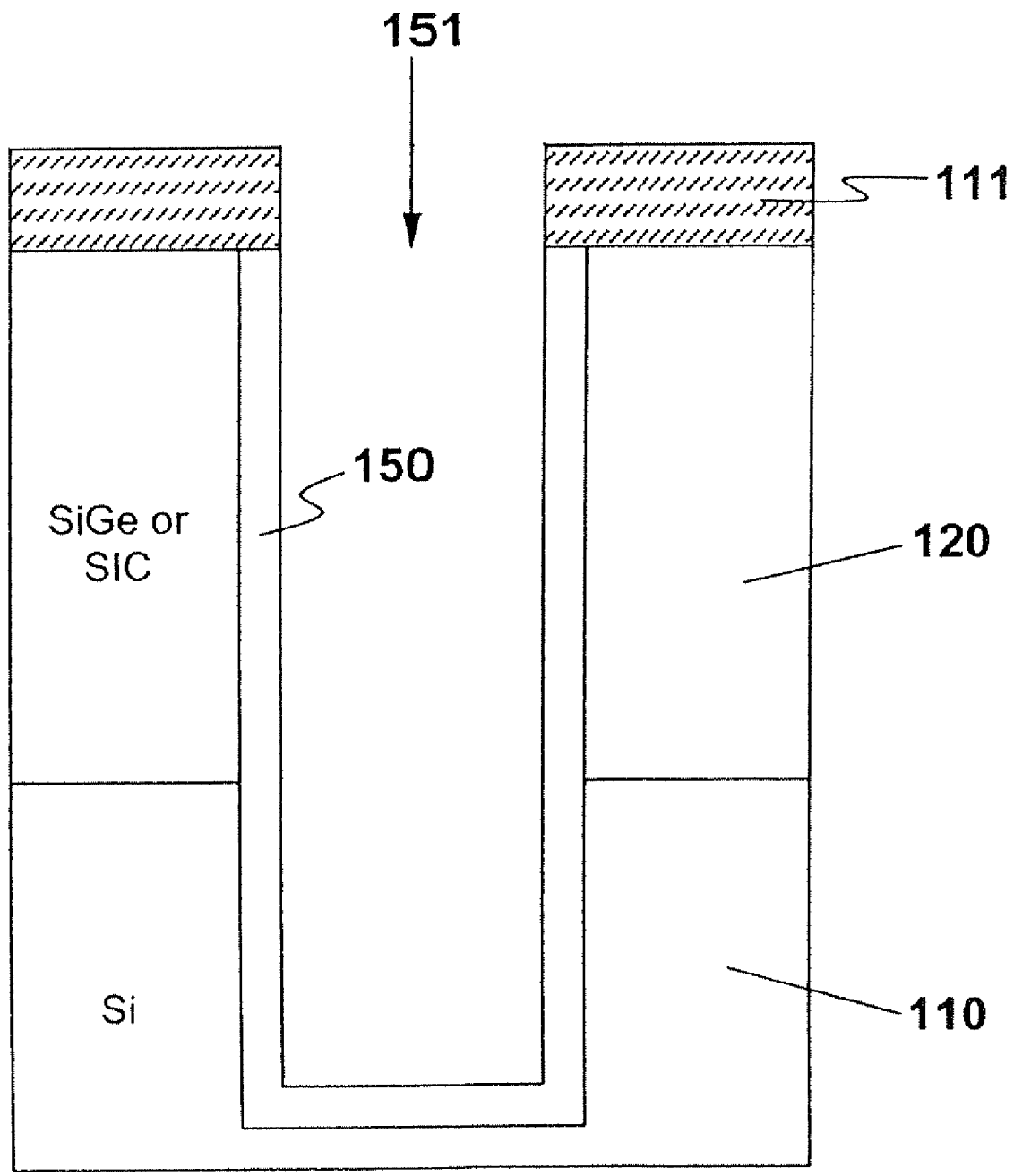

A pad layer 111, which comprises an insulating material(s) (preferably a nitride or a nitride with an underlying oxide), is provided to cover and protect the upper semiconductor substrate layer 120. Subsequently, a deep trench 151 is formed in the hybrid semiconductor substrate, which extends through the pad layer 111 and the upper semiconductor substrate layer 120 into the base substrate 110, followed by epitaxial growth of a silicon layer 150 over the interior surfaces of the trench 151, as shown in FIG. 6B.

A lower portion of the epitaxial silicon layer 150 is located over lower sidewalls of the trench 151 as defined by the base substrate 110. No lattice mismatch exists between the lower portion of the epitaxial silicon layer 150 and the base substrate 110, because both are formed of silicon. Therefore, the lower portion of the epitaxial silicon layer 150 is relaxed with little or no strain therein.

In contrast, an upper portion of the epitaxial silicon layer 150 is located over upper sidewalls of the trench 151 as defined by the upper semiconductor layer 120. Significant lattice mismatch exists between the upper portion of the epitaxial silicon layer 150 (which comprises silicon) and the upper semiconductor layer 120 (which comprises SiGe or SiC), which leads to generation of significant strain in the upper portion of the epitaxial silicon layer 150. Depending on the specific semiconductor material used for forming the upper semiconductor layer 120, the strain generated in the upper portion of the epitaxial silicon layer 150 can be either tensile or compressive. Specifically, if the upper semiconductor layer 120 comprises SiGe, the upper portion of the epitaxial silicon layer 150 will be tensilely strained, since SiGe has a larger lattice constant than Si. However, if the upper semiconductor layer 120 comprises SiC, the upper portion of the epitaxial silicon layer 150 will be compressively strained, since SiC has a smaller lattice constant than Si.

Figure 6C:
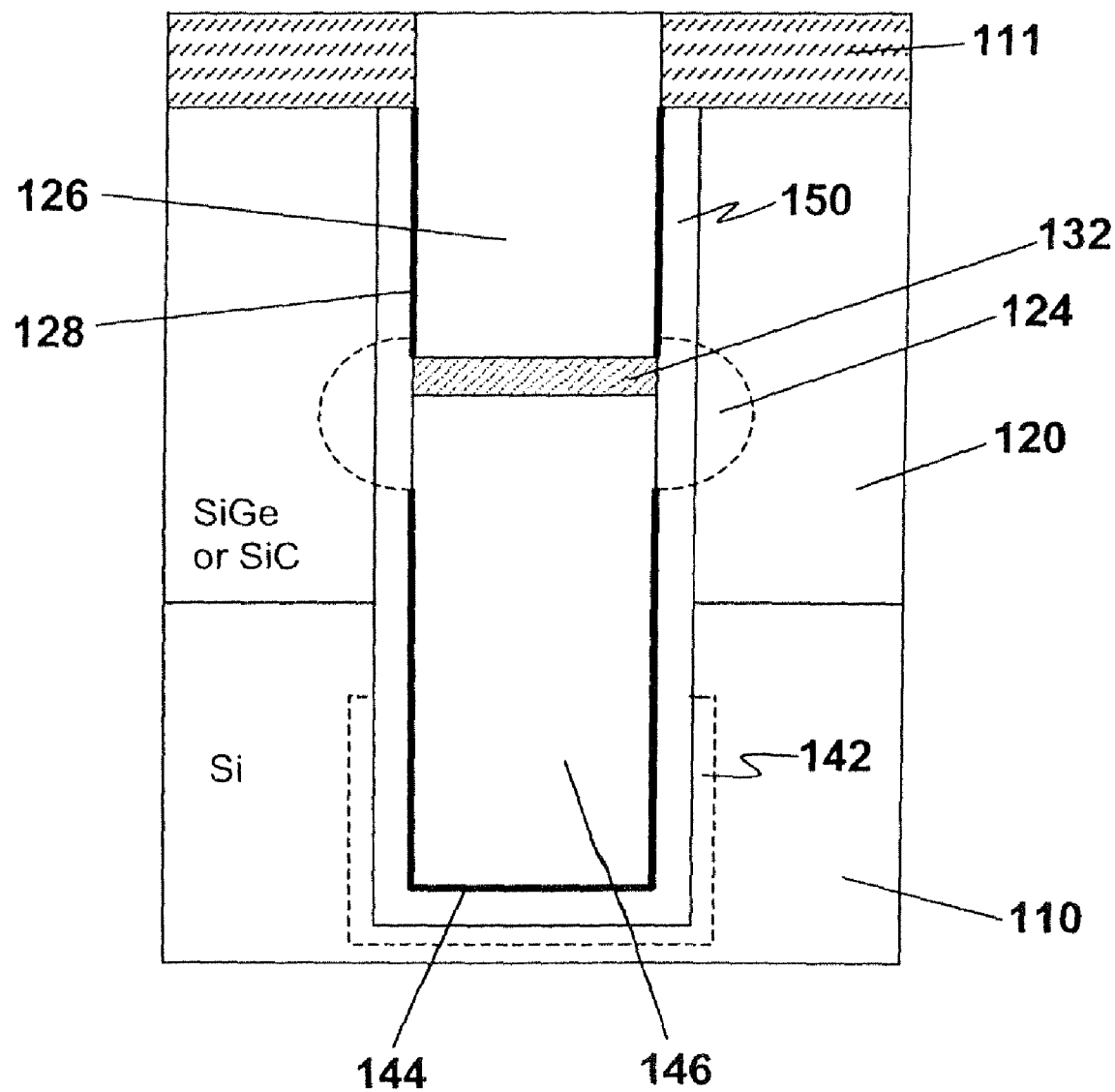

Next, conventional DRAM processing steps are carried out to form the outer electrode 142, the node dielectric layer 144, and the inner electrode 146 (as shown in FIG. 6C), which constitute the DT capacitor 104 of the DRAM cell 100 shown by FIG. 2. The conventional DRAM processing steps also from the TTO layer 132 and several components of the vertical MOSFET 102, including the drain (or buried strap out-diffusion) region 124, the gate dielectric layer 128, and the gate electrode 126. For forming an n-channel vertical MOSFET, the drain region 124 should be doped with an n-type dopant species. For forming a p-channel vertical MOSFET, the drain region 124 should be doped with a p-type dopant species. Note that no isolation collar is formed in the structure shown by FIG. 6C.

Figure 6D:
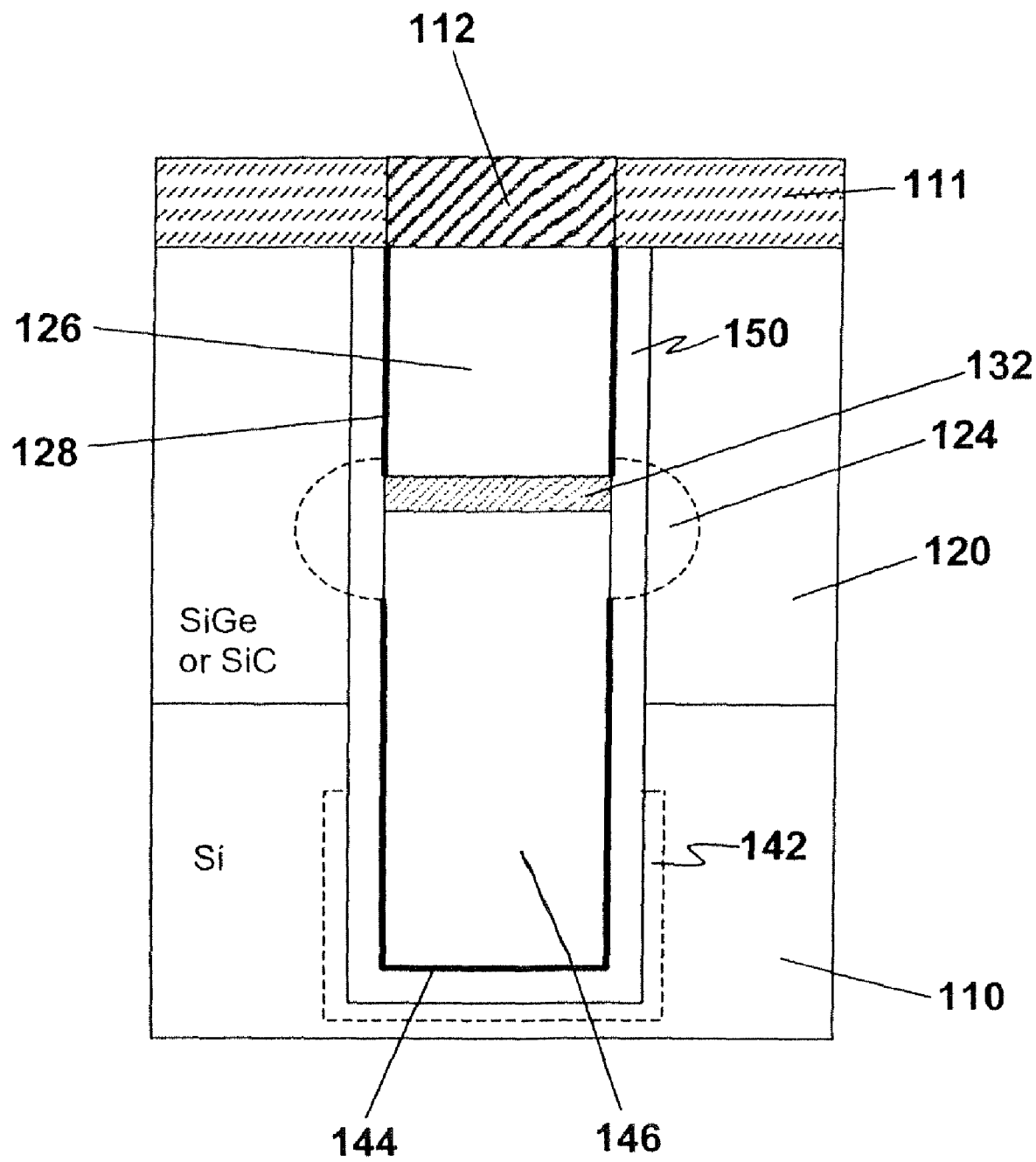

Subsequently, the gate electrode 126, which preferably comprises a doped polysilicon, is recessed, and then a conductive plug 112 is deposited in the recessed region to fill the trench opening, as shown in FIG. 6D.

Figure 6E:
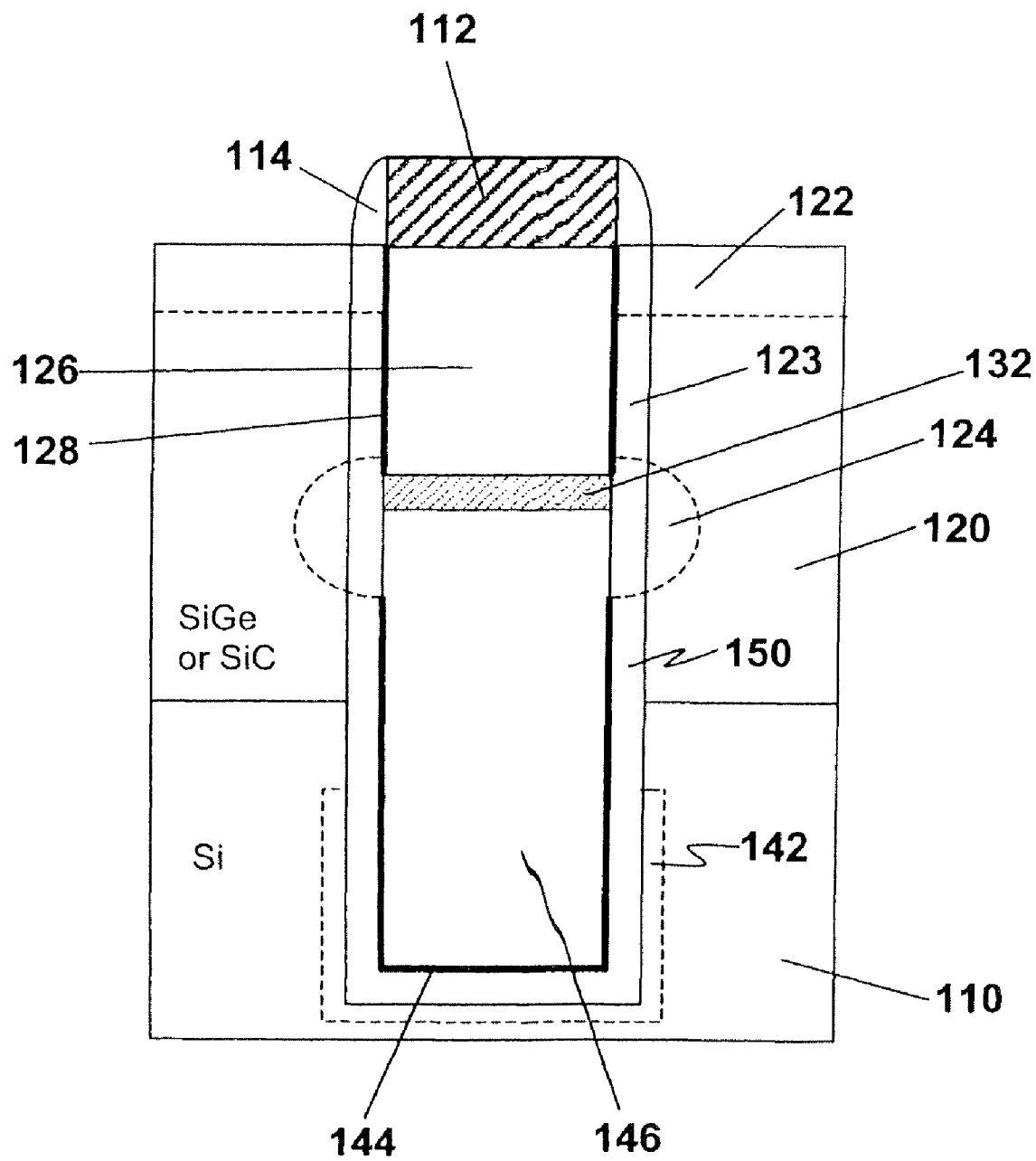

After formation of the conductive plug 112, the pad layer 111 is removed, and a dopant implantation step is carried out to dope upper portions of the upper semiconductor layer 120 and the epitaxial silicon layer 150 to form the source region 122 of the vertical MOSFET 102, as shown in FIG. 6E. For forming an n-channel vertical MOSFET, an n-type dopant species is employed during the dopant implantation step. For forming a p-channel vertical MOSFET, a p-type dopant species is employed instead.

Optional sidewall spacer 114 may be formed along sidewalls of the conductive plug 112. The sidewall spacer 114 may comprise any suitable insulating material, such as oxide, nitride, or oxynitride.

Figure 6F:
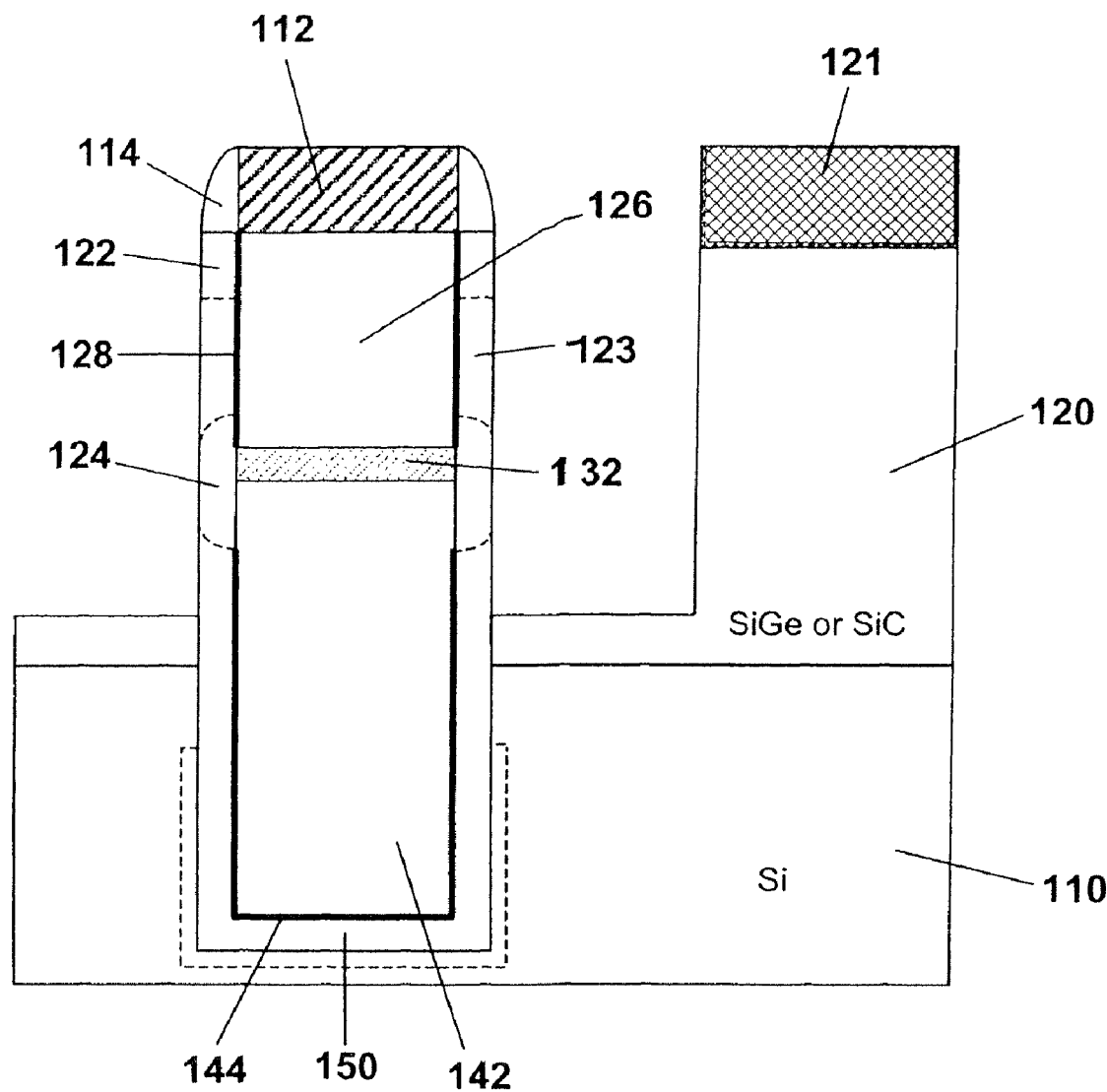

Selective removal of the upper semiconductor layer 120 is then carried out to remove a portion of the upper semiconductor layer 120 adjacent to the vertical MOSFET 102, thereby exposing the tensilely or compressively strained upper portion of the epitaxial silicon layer 150, as shown in FIG. 6F. Selective removal of the upper semiconductor layer 120 may be conducted by any suitable etching method or technique that selectively etches the SiGe or SiC contained in the upper semiconductor layer 120 over the Si contained in the epitaxial silicon layer 150, which stops at the silicon base substrate 110. Suitable etching techniques include, but are not limited to: dry etching processes, such as reactive-ion etching, ion beam etching, plasma etching or laser etching, wet etching processes that employ chemical etchants, or any combination thereof. A dielectric hard mask layer 121 is preferably provided during the etching process to prevent etching of other portions of the upper semiconductor layer 120 not adjacent to the vertical MOSFET 102.

The SiGe or SiC etching rate likely depends on the germanium or carbon concentration. The higher the SiGe or SiC concentration, the faster the etching rate will be. If the upper semiconductor layer 120 has a graded germanium or carbon profile, the etching may process at a very fast rate in the beginning and gradually slows down due to reduced germanium or carbon concentration. Moreover, the lowest portion of the layer 120 immediately adjacent to the silicon base substrate surface may have a sufficiently low germanium or carbon content for the selective etching to reach a complete stop before the base substrate 110 is exposed. In this manner, the lowest portion of the layer 120 will not be removed by the etching, as shown in FIG. 6F.

Figure 6G:
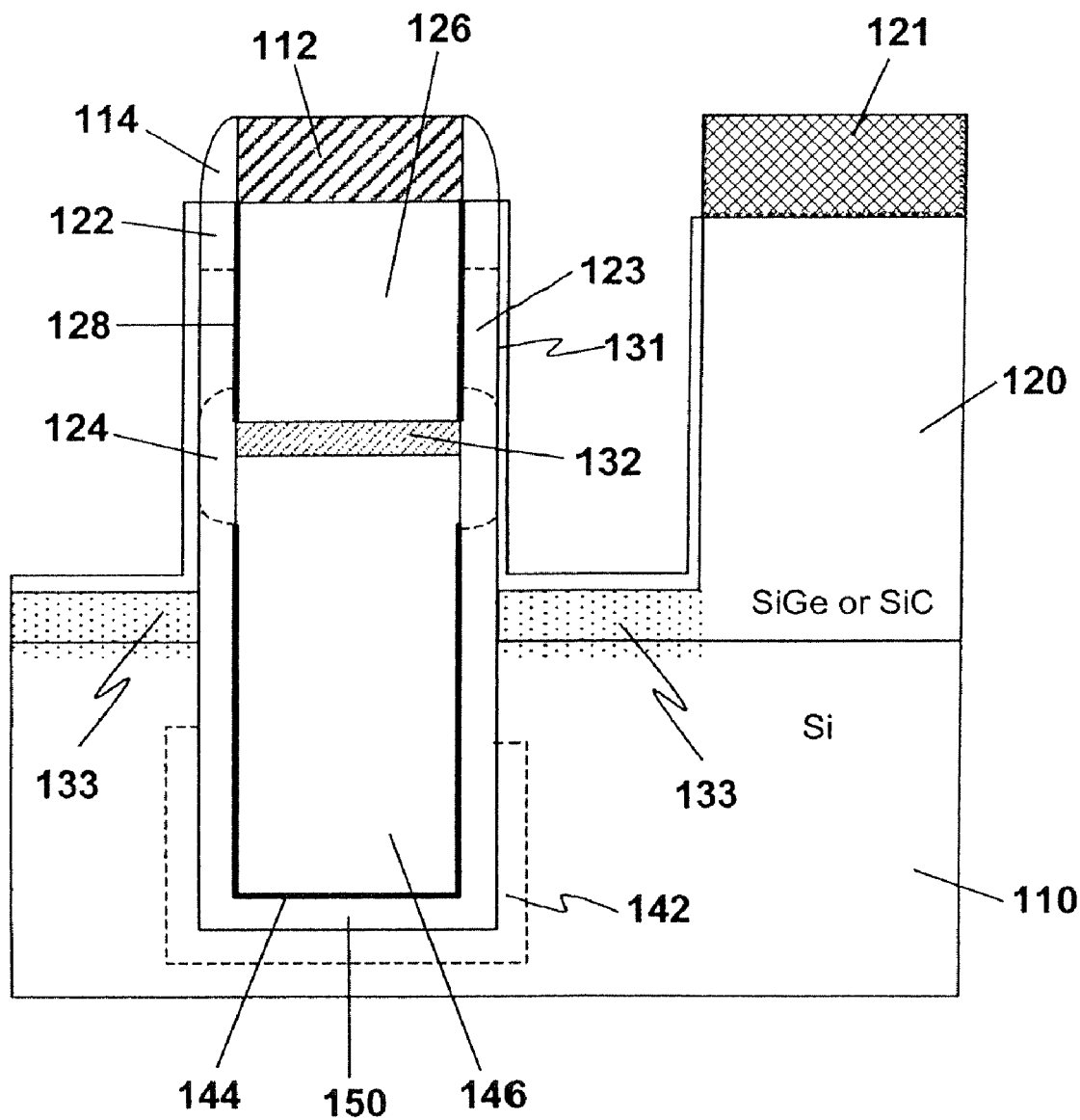

Next, a thin oxide layer 131 is optionally formed to cover sidewalls of the epitaxial silicon layer 150 and the un-removed portion of the upper semiconductor layer 120, followed by a second dopant implantation step to form doped regions 134, as shown in FIG. 6G. The second dopant implantation step employs a dopant species having a conductivity type opposite to the conductivity type of the outer electrode 142 of the DT capacitor 104 and the drain region 124 of the vertical MOSFET 102. For example, if the outer electrode 142 of the DT capacitor 104 and the drain region 124 of the vertical MOSFET 102 are n-doped, the regions 134 are p-doped. Alternatively, if the outer electrode 142 of the DT capacitor 104 and the drain region 124 of the vertical MOSFET 102 are p-doped, the regions 134 are n-doped. In this manner, the doped regions 134, which are located between the outer electrode 142 of the DT capacitor 104 and the drain region 124 of the vertical MOSFET 102, functions as an isolation structure to electrically isolate the outer electrode 142 of the DT capacitor 104 from the drain region 124 of the vertical MOSFET 102.

After formation of the doped regions 134, an insulating material (not shown) is deposited around the vertical MOSFET 102 to form the insulator structure 114 as shown in FIG. 2. After planarization of the deposited insulating material, the mask layer 121 is removed from the upper surface of the upper semiconductor layer 120, resulting in the DRAM cell as shown in FIG. 2. The thin oxide layer 131 covering the sidewalls of the epitaxial silicon layer 150 and the un-removed portion of the upper semiconductor substrate layer 120 may be stripped or remain before the insulator structure 114 is deposited. If the thin oxide layer 131 remains, it becomes a part of the insulator structure 114 around the vertical MOSFET 102.

Further, a planar silicon layer can be epitaxially grown over an un-removed portion of the upper semiconductor layer 120. Due to the lattice mismatch between Si and SiGe or SiC, the planar silicon layer will contain either tensile or compressive strain, and it therefore can be used to form the planar channel layer 163 of the planar MOSFET 106 as shown in FIG. 4.

For forming the alternatively embodiment shown in FIG. 3, similar processing steps as described hereinabove can be employed, with the exception that during the conventional DRAM processing steps, an isolation collar is formed over the epitaxial semiconductor layer 150 between the outer electrode 142 of the DT capacitor 104 and the drain region 124 of the vertical MOSFET 102.

Figure 7A:
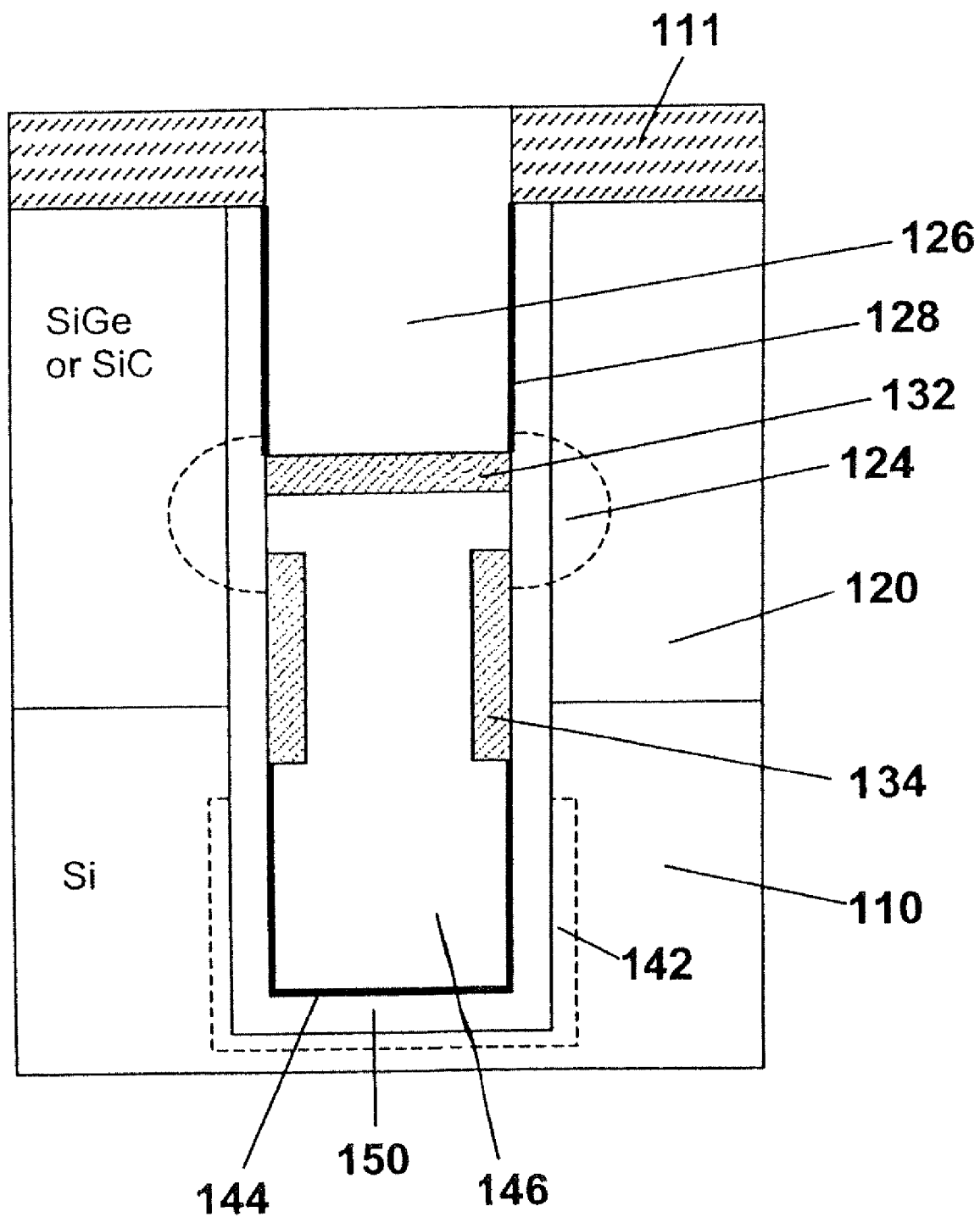
FIGS. 7A-7D are cross sectional views that illustrate the processing steps for forming the DRAM cell of FIG. 3, according to one embodiment of the present invention.
Figure 7B:
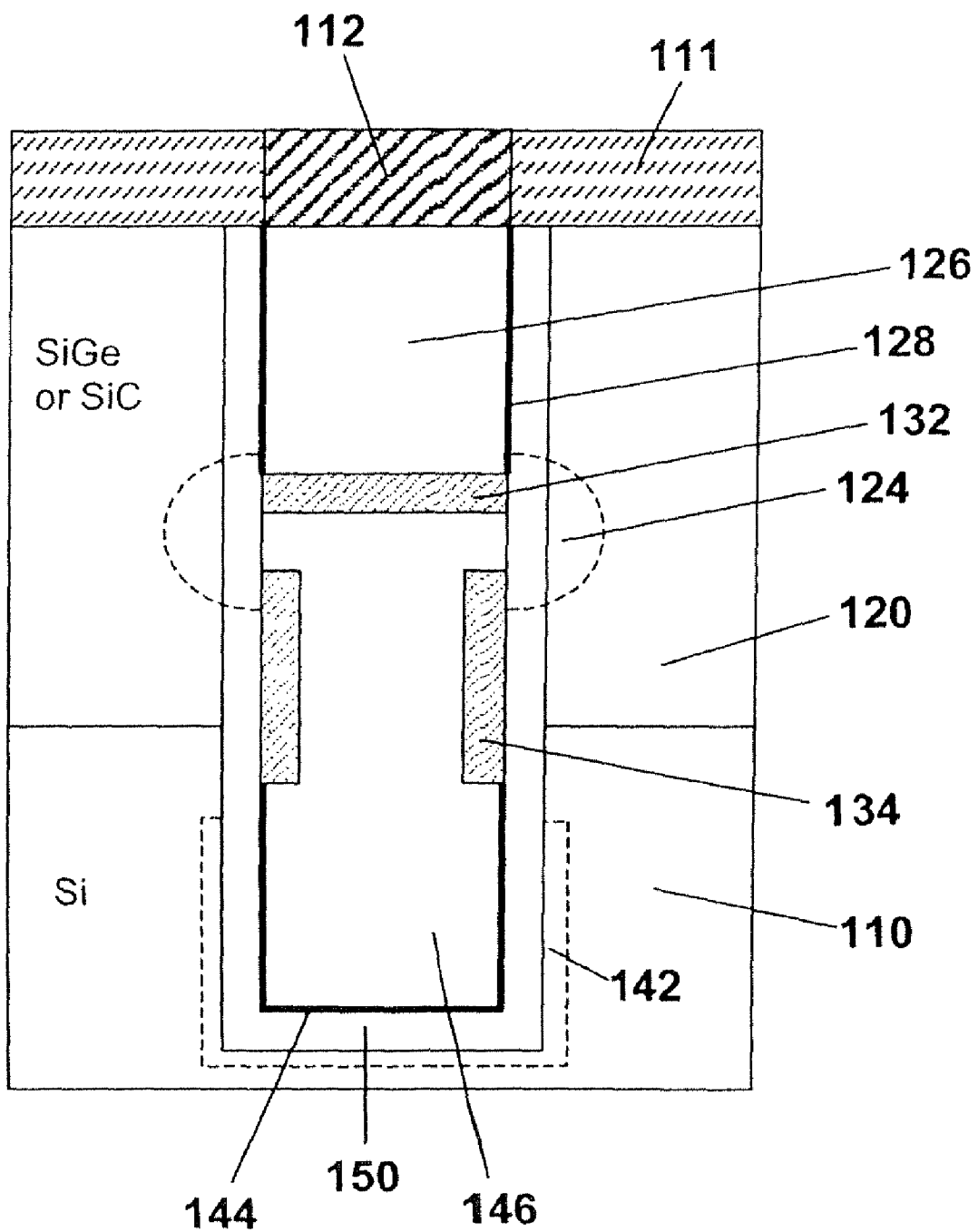
Figure 7C:
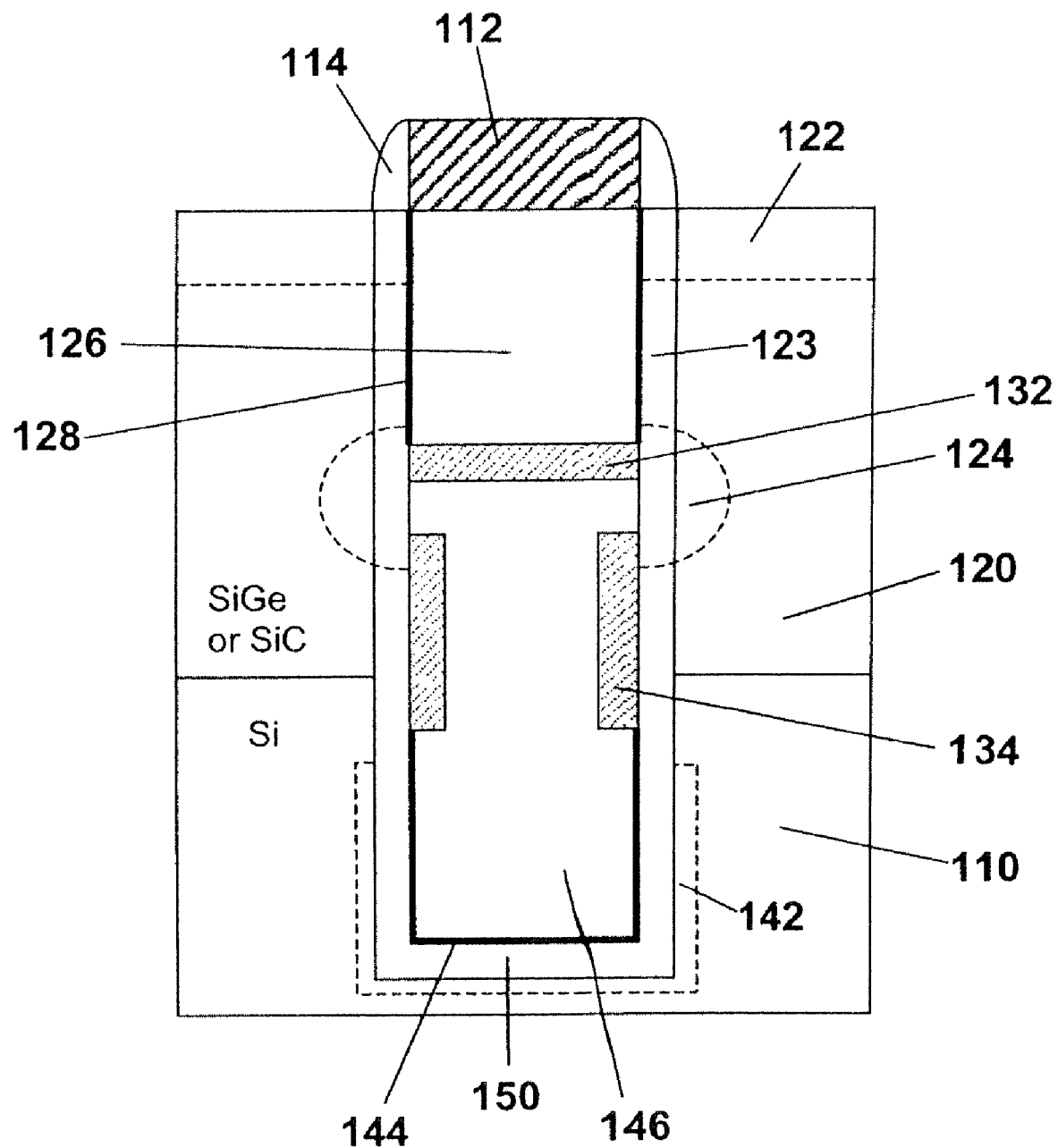
Figure 7D:
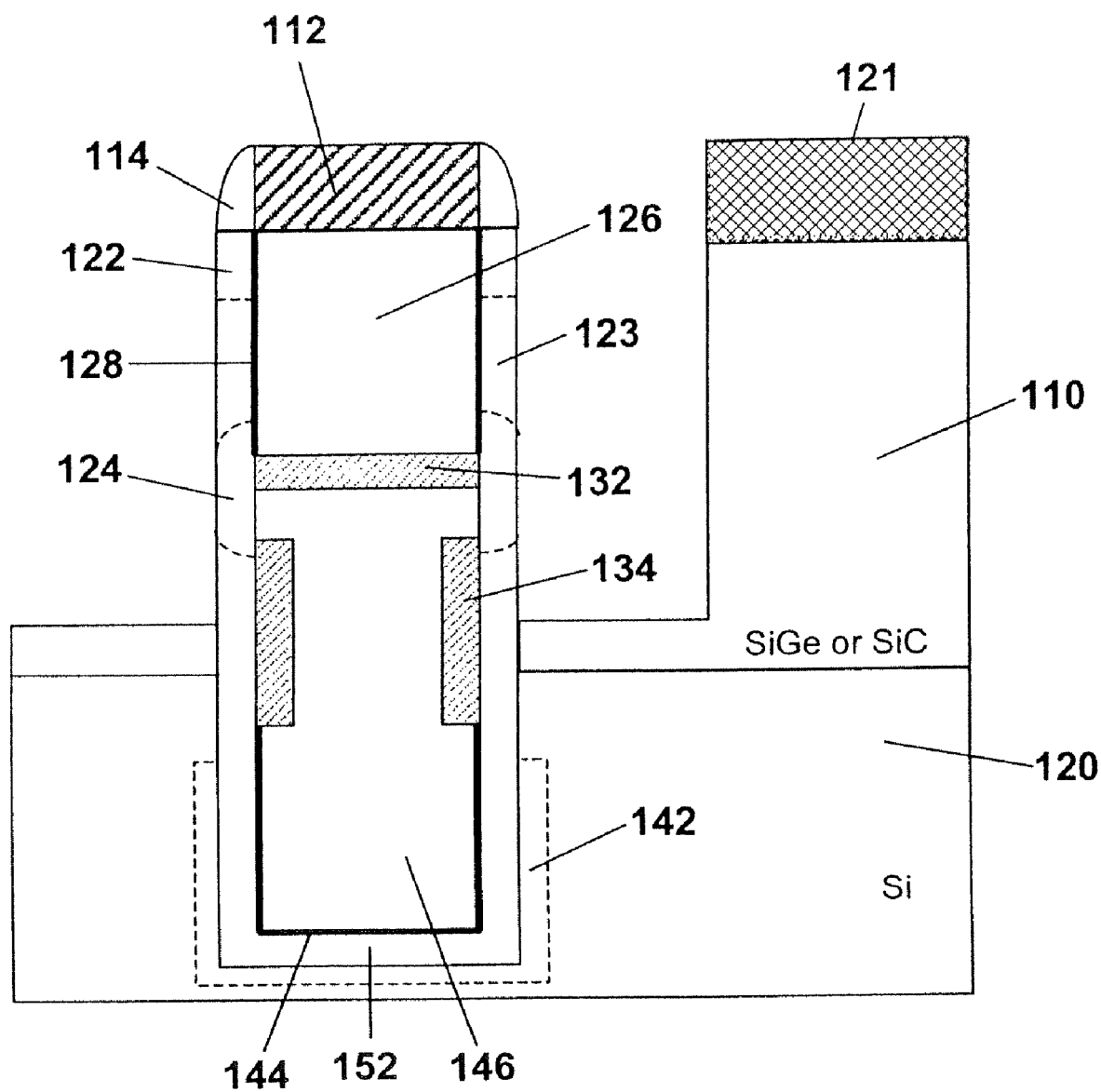

Specifically, FIG. 7A shows formation of the outer electrode 142, the node dielectric layer 144, the inner electrode 146, the isolation collar 133, the TTO layer 132, the drain region 124, the gate dielectric layer 128, and the gate electrode 126 by conventional DRAM processing steps, after epitaxial growth of the silicon layer 150 in the trench. FIGS. 7B-7D show substantially the same processing steps as those shown in FIGS. 6D-6F. However, the processing step for forming the doped regions 134 as shown in FIG. 6G is no longer necessary in this alternative embodiment, and the insulation material can be deposited around the vertical MOSFET immediately after selective removal of a portion of the upper semiconductor layer 120.

In summary, the present invention provides an improved vertical MOSFET structure that can be fabricated using simple processing steps and can be readily integrated with existing semiconductor devices. Further, the thickness of the vertical channel layer of the improved vertical MOSFET can be precisely controlled by an epitaxial growth step, therefore avoiding use of the error-prone subtractive etching technique.

While FIGS. 1-7 illustratively demonstrate several exemplary device structures and processing steps according to specific embodiments of the present invention, it is clear that a person ordinarily skilled in the art can readily modify such device structures and process steps for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A semiconductor device comprising:
    at least one trench capacitor located in a bottom portion of a trench that is present in a semiconductor substrate, wherein the at least one trench capacitor comprises an outer electrode, an inner electrode, and a node dielectric layer located between the outer electrode and the inner electrode; and
    at least one vertical transistor located over the at least one trench capacitor that is present in an upper portion of the trench, wherein said at least one vertical transistor comprises a source region, a drain region, a channel region, a gate dielectric, and a gate electrode, wherein the channel region, the source region, and the drain region of the at least one vertical transistor are located in a single layer of a tensilely or compressively strained semiconductor material that is oriented perpendicularly to and in direct contact with a surface of the semiconductor substrate, the single layer of the tensilely or compressively strained semiconductor material having a different lattice constant than the semiconductor substrate, wherein the single layer of the tensilely or compressively strained semiconductor material including the source region and the drain region is embedded and in direct contact with an insulator structure present in a portion of a sidewall of the trench that is located over the semiconductor substrate, so that the at least one vertical transistor has a semiconductor-on-insulator (SOI) configuration, wherein the single layer of tensilely or compressively strained semiconductor material extends along sidewalls and a bottom wall of the trench that is present in the semiconductor substrate.

2. The semiconductor device of claim 1, wherein the single layer of the tensilely or compressively strained semiconductor material has a thickness ranging from about 5 nm to about 100 nm.

3. The semiconductor device of claim 1, wherein the at least one vertical transistor is an n-channel field effect transistor (n-FET), and wherein the single layer of the tensilely or compressively strained semiconductor material in which the channel region of said at least one vertical transistor is located is tensilely strained.

4. The semiconductor device of claim 1, wherein the at least one vertical transistor is a p-channel field effect transistor (p-FET), and wherein the single layer of the tensilely or compressively strained semiconductor material in which the channel region of said at least one vertical transistor is located is compressively strained.

5. The semiconductor device of claim 1, wherein the inner electrode of the at least one trench capacitor is electrically connected to the drain region of the at least one vertical transistor, and wherein the outer electrode of the at least one trench capacitor is separated from the drain region of the at least one vertical transistor by an insulator or a semiconductor region having an opposite conductivity type as the drain region.

6. The semiconductor device of claim 5, wherein the insulator separating the outer electrode from the drain region of the at least one vertical transistor is an isolation collar that comprises an insulating material.

7. The semiconductor device of claim 1, further comprising at least one element selected from the group consisting of transistors, diodes, capacitors, resistors, and inductors.

8. The semiconductor device of claim 1, further comprising a planar field effect transistor (PET) with a tensilely or compressively strained channel region.

9. A semiconductor device located over a semiconductor substrate and comprising at least one vertical transistor having a source region, a drain region, a channel region, a gate dielectric, and a gate electrode, wherein the source region, the drain region and the channel region each being present in a single layer of a tensilely or compressively strained semiconductor material that is in direct contact with the semiconductor substrate, wherein the channel region of the at least one vertical transistor is located in a tensilely or compressively strained semiconductor layer that is the single layer of the tensilely or compressively strained semiconductor material being oriented perpendicularly to a surface of the semiconductor substrate and being composed of a material having a different lattice constant than the semiconductor substrate, wherein the single layer of the tensilely or compressively strained semiconductor material including at least the source region and the drain region of the vertical transistor is embedded in and in direct contact with an insulator structure located over the semiconductor substrate, so that the at least one vertical transistor has a semiconductor-on-insulator (SOI) configuration, wherein the single layer of tensilely or compressively strained semiconductor material extends along sidewalls and a bottom wall of the trench that is present in the semiconductor substrate.

10. The semiconductor device of claim 9, wherein the tensilely or compressively strained semiconductor layer has a thickness ranging from about 5 nm to about 100 nm.

* * * * *